(12) United States Patent
Song

(10) Patent No.: US 12,120,872 B2
(45) Date of Patent: Oct. 15, 2024

(54) THREE-DIMENSIONAL FLASH MEMORY HAVING IMPROVED DEGREE OF INTEGRATION, AND MANUFACTURING METHOD THEREFOR

(71) Applicant: Samsung Electronics Co., Ltd., Suwon-si (KR)

(72) Inventor: Yunheub Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 555 days.

(21) Appl. No.: 17/432,473

(22) PCT Filed: Jan. 28, 2020

(86) PCT No.: PCT/KR2020/001274
§ 371 (c)(1),
(2) Date: Aug. 19, 2021

(87) PCT Pub. No.: WO2020/175805
PCT Pub. Date: Sep. 3, 2020

(65) Prior Publication Data
US 2022/0139953 A1  May 5, 2022

(30) Foreign Application Priority Data

Feb. 26, 2019 (KR) .................. 10-2019-0022149
Feb. 26, 2019 (KR) .................. 10-2019-0022150

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
None
See application file for complete search history.

(56) References Cited

U.S. PATENT DOCUMENTS 8,115,259 B2  2/2012  Shim et al.
9,159,767 B2  10/2015  Park et al.
(Continued)

FOREIGN PATENT DOCUMENTS

CN    104051609 A    9/2014
CN    105097817 A    11/2015
(Continued)

OTHER PUBLICATIONS

First Office Action for corresponding CN Patent Application No. 202080015493.X dated Jun. 17, 2023.
(Continued)

*Primary Examiner* — Nduka E Ojeh
(74) *Attorney, Agent, or Firm* — Muir Patent Law, PLLC

(57) ABSTRACT

Provided are a 3-dimensional (3D) flash memory with an improved degree of integration and a method of manufacturing the same. The 3D flash memory may include at least one vertical string formed to extend in one direction on a substrate and comprising a channel layer formed to extend in the one direction and a charge storage layer formed to extend in the one direction so as to surround the channel layer; a plurality of electrode layers stacked to be vertically connected to the at least one vertical string; and a source line formed to be buried in the substrate.

20 Claims, 21 Drawing Sheets

(56) References Cited

U.S. PATENT DOCUMENTS

| | | |
|---|---|---|
| 9,287,286 B2 | 3/2016 | Kim et al. |
| 9,431,416 B2 | 8/2016 | Nam et al. |
| 9,559,116 B2 | 1/2017 | Kim et al. |
| 9,780,096 B2 | 10/2017 | Park et al. |
| 9,786,673 B1 * | 10/2017 | Cho ........................ H10B 43/30 |
| 9,818,758 B2 | 11/2017 | Lee |
| 10,396,093 B2 | 8/2019 | Song et al. |
| 10,411,032 B2 | 9/2019 | Kim et al. |
| 10,541,033 B2 | 1/2020 | Jung et al. |
| 2010/0193861 A1 * | 8/2010 | Shim ................. H01L 29/66825 257/329 |
| 2010/0258947 A1 | 10/2010 | Jeong et al. |
| 2015/0303209 A1 | 10/2015 | Park et al. |
| 2016/0027796 A1 | 1/2016 | Yang et al. |
| 2016/0267991 A1 * | 9/2016 | Hashimoto ............ H10B 43/10 |
| 2017/0133389 A1 * | 5/2017 | Yun ........................ H01L 23/528 |
| 2020/0286914 A1 | 9/2020 | Song |

FOREIGN PATENT DOCUMENTS

| | | |
|---|---|---|
| JP | H07147389 A | 6/1995 |
| KR | 1020100088829 A | 8/2010 |
| KR | 1020150048553 A | 5/2015 |
| KR | 1020150122369 A | 11/2015 |
| KR | 1020160021376 A | 2/2016 |
| KR | 1020160087691 A | 7/2016 |
| KR | 1020170053030 A | 5/2017 |
| KR | 1020180021563 A | 3/2018 |
| KR | 1020180096877 A | 8/2018 |
| KR | 1020190001624 A | 1/2019 |
| KR | 1020190014616 A | 2/2019 |

OTHER PUBLICATIONS

International Search Report dated May 12, 2020 for PCT/KR2020/001274.
Notice of Allowance dated Apr. 3, 2021 from the Korean Intellectual Property Office for Corresponding Korean Application KR 10-2019-0022149.
Notice of Allowance dated Oct. 30, 2020 from the Korean Intellectual Property Office for Corresponding Korean Application KR 10-2019-0022150.
Second Office Action dated Oct. 30, 2020 from the Korean Intellectual Property Office for Corresponding Korean Application KR 10-2019-0022149.

* cited by examiner

THREE-DIMENSIONAL FLASH MEMORY HAVING IMPROVED DEGREE OF INTEGRATION, AND MANUFACTURING METHOD THEREFOR

TECHNICAL FIELD

The embodiments relate to a 3-dimensional (3D) flash memory and a method of manufacturing the same, and more particularly, to a technology for improving a degree of integration of a 3D flash memory.

BACKGROUND ART

A flash memory device is an electrically erasable programmable read only memory (EEPROM). This type of memory may be used in, for example, computers, digital cameras, MP3 playerd, game systems, memory sticks, etc. The flash memory device electrically controls data input/output by Fowler-Nordheim tunneling or hot electron injection.

Specifically, referring to FIG. 1 showing an array of a 3D flash memory of the related art, the array of the 3D flash memory may include a common source line CSL, a bit line BL, and a plurality of cell strings CSTR disposed between the common source line CSL and the bit line BL.

Bit lines are arranged two-dimensionally, and the plurality of cell strings CSTR are connected in parallel to each of the bit lines. The cell strings CSTR may be connected commonly to the common source line CSL. That is, the plurality of cell strings CSTR may be disposed between the plurality of bit lines and one common source line CSL. In this regard, there may be a plurality of common source lines CSL, and the plurality of common source lines CSL may be two-dimensionally arranged. The same voltage may be electrically applied to the plurality of common source lines CSL, or each of the plurality of common source lines CSL may be electrically controlled.

Each of the cell strings CSTR may include a ground selection transistor GST connected to the common source line CSL, a string selection transistor SST connected to the bit line BL, and a plurality of memory cell transistors MCT disposed between ground and the string selection transistors GST and SST. In addition, the ground selection transistor GST, the string selection transistor SST, and the memory cell transistors MCT may be connected in series.

The common source line CSL may be commonly connected to sources of the ground selection transistors GST. In addition, the ground selection line GSL disposed between the common source line CSL and the bit line BL, a plurality of word lines WL0-WL3, and a plurality of string selection lines SSL may be used as electrode layers of the ground selection transistor GST, the memory cell transistors MCT, and the string select transistors SST, respectively. In addition, each of the memory cell transistors MCT includes a memory element.

In order to meet the consumers' requirements for excellent performance and low price, the 3D flash memory of the related art has an increased degree of integration due to vertically stacked cells.

For example, referring to FIG. 2 showing the structure of a 3D flash memory of the related art, the 3D flash memory may be manufactured to include an electrode structure 215 in which interlayer insulating layers 211 and horizontal structures 250 are alternately repeatedly formed on a substrate 200. The interlayer insulating layers 211 and the horizontal structures 250 may extend in a first direction. The interlayer insulating layers 211 may be, for example, silicon oxide layers, and a lowermost interlayer insulating layer 211a of the interlayer insulating layers 211 may have a thickness less than that of the remaining interlayer insulating layers 211. Each of the horizontal structures 250 may include first and second blocking insulating layers 242 and 243 and an electrode layer 245. A plurality of electrode structures 215 may be provided, and the plurality of electrode structures 215 may be disposed facing each other in a second direction crossing the first direction. The first and second directions may correspond to the x-axis and y-axis of FIG. 2, respectively. Trenches 240 may extend between the plurality of electrode structures 215 in the first direction to separate the plurality of electrode structures 215 from each other.

Vertical structures 230 passing through the electrode structure 215 may be disposed. For example, the vertical structures 230 may be arranged in a matrix form by being aligned along the first and second directions in a plan view. As another example, the vertical structures 230 may be aligned in the second direction while being arranged in a zigzag shape in the first direction. Each of the vertical structures 230 may include a protective layer 224, a charge storage layer 225, a tunnel insulating layer 226, and a channel layer 227. For example, the channel layer 227 may be disposed in a hollow tube shape, and in this case, a buried layer 228 filled in the inside of the channel layer 227 may be further disposed. A drain region D may be disposed on the channel layer 227 and a conductive pattern 229 may be formed on the drain region D to be connected to the bit line BL. The bit line BL may extend in a direction crossing the horizontal structures 250, for example, in the second direction. For example, the vertical structures 230 aligned in the second direction may be connected to one bit line BL.

The first and second blocking insulating layers 242 and 243 included in the horizontal structures 250 and the charge storage layer 225 and the tunnel insulating layer 226 included in the vertical structures 230 may each be an oxide-nitride-oxide (ONO) layer, which is an information storage element. That is, some information storage elements may be included in the vertical structures 230, and the remaining ones may be included in the horizontal structures 250. For example, among the information storage elements, the charge storage layer 225 and the tunnel insulating layer 226 may be included in the vertical structures 230, and the first and second blocking insulating layers 242 and 243 may be included in the horizontal structures 250.

Epitaxial patterns 222 may be disposed between the substrate 200 and the vertical structures 230. The epitaxial patterns 222 connect the substrate 200 to the vertical structures 230. The epitaxial patterns 222 may contact the horizontal structures 250 of at least one layer. That is, the epitaxial patterns 222 may be disposed to contact the lowermost horizontal structure 250. According to another embodiment, the epitaxial patterns 222 may be arranged to contact the horizontal structures 250 of a plurality of layers, for example, two layers. When the epitaxial patterns 222 are disposed to contact the lowermost horizontal structure 250, the lowermost horizontal structure 250 may be thicker than the remaining horizontal structures 250. The lowermost horizontal structure 250 contacting the epitaxial patterns 222 may correspond to the ground selection line GSL of the array of the 3D flash memory described with reference to FIG. 1, and the remaining horizontal structures 250 contacting the vertical structures 230 may correspond to the plurality of word lines WL0 to WL3.

Each of the epitaxial patterns 222 has a recessed sidewall 222a. Accordingly, the lowermost horizontal structure 250 contacting the epitaxial patterns 222 is disposed along a profile of the recessed sidewall 222a. That is, the lowermost horizontal structure 250 may be disposed in an inwardly convex shape along the recessed sidewalls 222a of the epitaxial patterns 222.

The 3D flash memory of the related art having such a structure in which the common source line CSL is formed to occupy a certain space on an upper portion of a substrate has a limitation in improving a degree of horizontal integration. Also, due to use of a staggered arrangement structure of a plurality of vertical strings in which six peripheral vertical strings are arranged around a center vertical string under the same space, the 3D flash memory of the related art has a disadvantage in that a visual process must be performed several times in a process of forming the plurality of vertical strings.

Accordingly, there is a need for a technology to overcome the limitation and disadvantage of the 3D flash memory of the related art.

DESCRIPTION OF EMBODIMENTS

Technical Problem

The present invention provides a technology for improving a degree of integration of a 3-dimensional (3D) flash memory.

More specifically, the present invention provides a 3D flash memory having an improved degree of integration due to forming of a source line buried in a substrate and a method of manufacturing the 3D flash memory.

In addition, the present invention provides a 3D flash memory of which a manufacturing process is simplified while simultaneously achieving an improved degree of integration and a method of manufacturing the 3D flash memory.

Specifically, the present invention provides a 3D flash memory in which a plurality of vertical strings are grouped into at least two or more groups having different cross-sectional areas.

In this regard, the present invention provides a 3D flash memory in which a plurality of vertical strings have different cross-sectional areas for each group, thereby implementing characteristics of different amounts of data storage for each group.

In addition, the present invention provides a method of manufacturing a 3D flash memory in which a plurality of vertical strings are formed for each group through different etching processes, and vertical strings included in one group are formed simultaneously through the same etching process, thereby simplifying a manufacturing process and simultaneously minimizing etching errors.

Solution to Problem

According to an aspect of the present invention, there is provided a 3-dimensional (3D) flash memory including at least one vertical string formed to extend in one direction on a substrate and including a channel layer formed to extend in the one direction and a charge storage layer formed to extend in the one direction so as to surround the channel layer; a plurality of electrode layers stacked to be vertically connected to the at least one vertical string; and a source line formed to be buried in the substrate.

The 3D flash memory may further include an N+ doped polysilicon layer formed to be buried in the substrate on an upper portion of the source line.

The source line may be formed to be common and usable by the at least one vertical string.

According to another aspect of the present invention, there is provided a method of manufacturing a 3D flash memory including etching a part of a substrate; generating a sacrificial layer in a space in which the part of the substrate is etched; forming at least one vertical string on the substrate including the sacrificial layer to extend in one direction and generating a plurality of electrode layers stacked to be vertically connected to the at least one vertical string; and removing the sacrificial layer to form a source line to be buried in the substrate in a space from which the sacrificial layer is removed.

The generating of the sacrificial layer may include forming an N+ doped polysilicon layer on an upper portion of the sacrificial layer so as to be buried in the substrate.

The etching of the part of the substrate may include etching the part of the substrate so that a source line to be formed in a space in which the part of the substrate is etched is common and usable by the at least one vertical string.

According to another aspect of the present invention, there is provided a method of manufacturing a 3D flash memory including etching a part of a substrate; generating a sacrificial layer in a space in which the part of the substrate is etched; forming at least one vertical string on the substrate including the sacrificial layer to extend in one direction and generating a plurality of sacrificial layers stacked to be vertically connected to the at least one vertical string; removing the plurality of sacrificial layers to form a plurality of electrode layers in spaces from which the plurality of sacrificial layers are removed; and removing the sacrificial layer to form a source line to be buried in the substrate in a space from which the sacrificial layer is removed.

The forming of the plurality of electrode layers and the forming of the source line may be performed simultaneously.

The generating of the sacrificial layer may include forming an N+ doped polysilicon layer on an upper portion of the sacrificial layer so as to be buried in the substrate.

The etching of the part of the substrate may include etching the part of the substrate so that a source line to be formed in a space in which the part of the substrate is etched is common and usable by the at least one vertical string.

According to another aspect of the present invention, there is provided a 3D flash memory including a plurality of vertical strings formed to extend in one direction and each including a channel layer formed to extend in the one direction and a charge storage layer formed to extend in the one direction so as to surround the channel layer, wherein the plurality of vertical strings are grouped into at least two or more groups having different cross-sectional areas.

The plurality of vertical strings may be formed through different etching processes for each of the groups.

The plurality of vertical strings may be vertical strings included in one group and formed simultaneously through the same etching process.

According to another aspect of the present invention, there is provided a method of manufacturing a 3D flash memory including a plurality of vertical strings formed to extend in one direction and each including a channel layer formed to extend in the one direction and a charge storage layer formed to extend in the one direction so as to surround the channel layer, the method including forming a plurality of vertical holes in which a plurality of vertical strings are to be generated by performing different etching processes on the plurality of vertical strings grouped into at least two or more groups having different cross-sectional areas.

The forming of the plurality of vertical holes may include forming the vertical holes in which the vertical strings included in one group are to be formed simultaneously through the same etching process.

Advantageous Effects of Disclosure

The present invention provides a technology for improving a degree of integration of a 3-dimensional (3D) flash memory.

More specifically, the present invention provides a 3D flash memory having an improved degree of integration due to forming of a source line buried in a substrate and a method of manufacturing the 3D flash memory.

In addition, the present invention provides a 3D flash memory of which a manufacturing process is simplified while simultaneously achieving a degree of integration and a method of manufacturing the 3D flash memory.

Specifically, the present invention provides a 3D flash memory in which a plurality of vertical strings are grouped into at least two or more groups having different cross-sectional areas.

In this regard, the present invention provides a 3D flash memory in which a plurality of vertical strings have different cross-sectional areas for each group, thereby implementing characteristics of different amounts of data storage for each group.

In addition, the present invention provides a method of manufacturing a 3D flash memory in which a plurality of vertical strings are formed for each group through different etching processes, and vertical strings included in one group are formed simultaneously through the same etching process, thereby simplifying a manufacturing process and simultaneously minimizing etching errors.

BEST MODE

Figure 1:
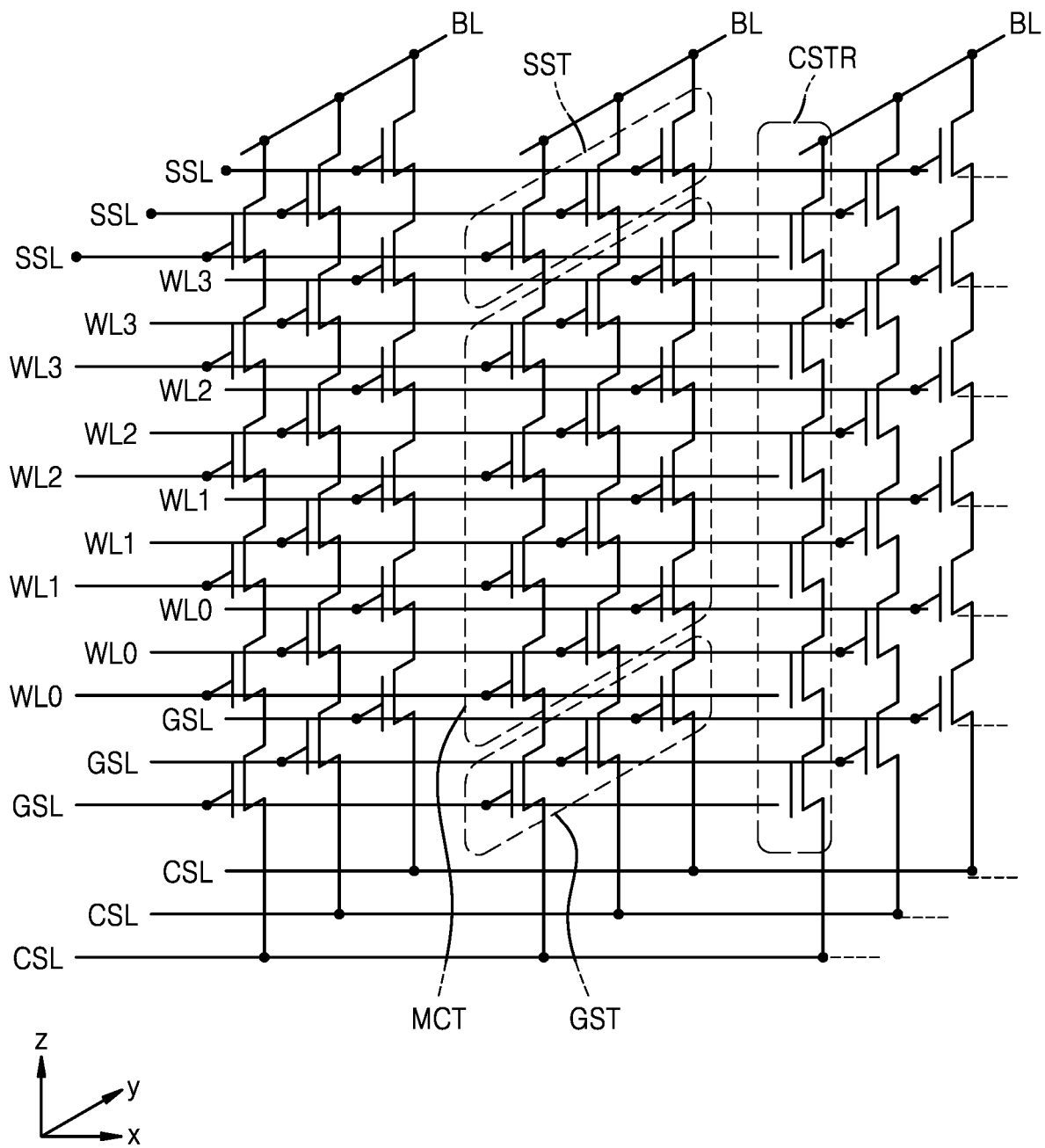
FIG. 1 is a schematic circuit diagram showing an array of a 3D flash memory of the related art.

Hereinafter, embodiments will be described in detail with reference to the accompanying drawings. However, the present invention is not restricted or limited by the embodiments. In addition, the same reference numerals shown in each drawing denotes the same members.

In addition, terminologies used in the present specification are those used to properly express preferred embodiments of the present invention, which may vary depending on users, the intention of operators, or customs in the field to which the present invention belongs. Therefore, definitions of these terminologies should be made based on descriptions throughout the present specification.

Figure 3:
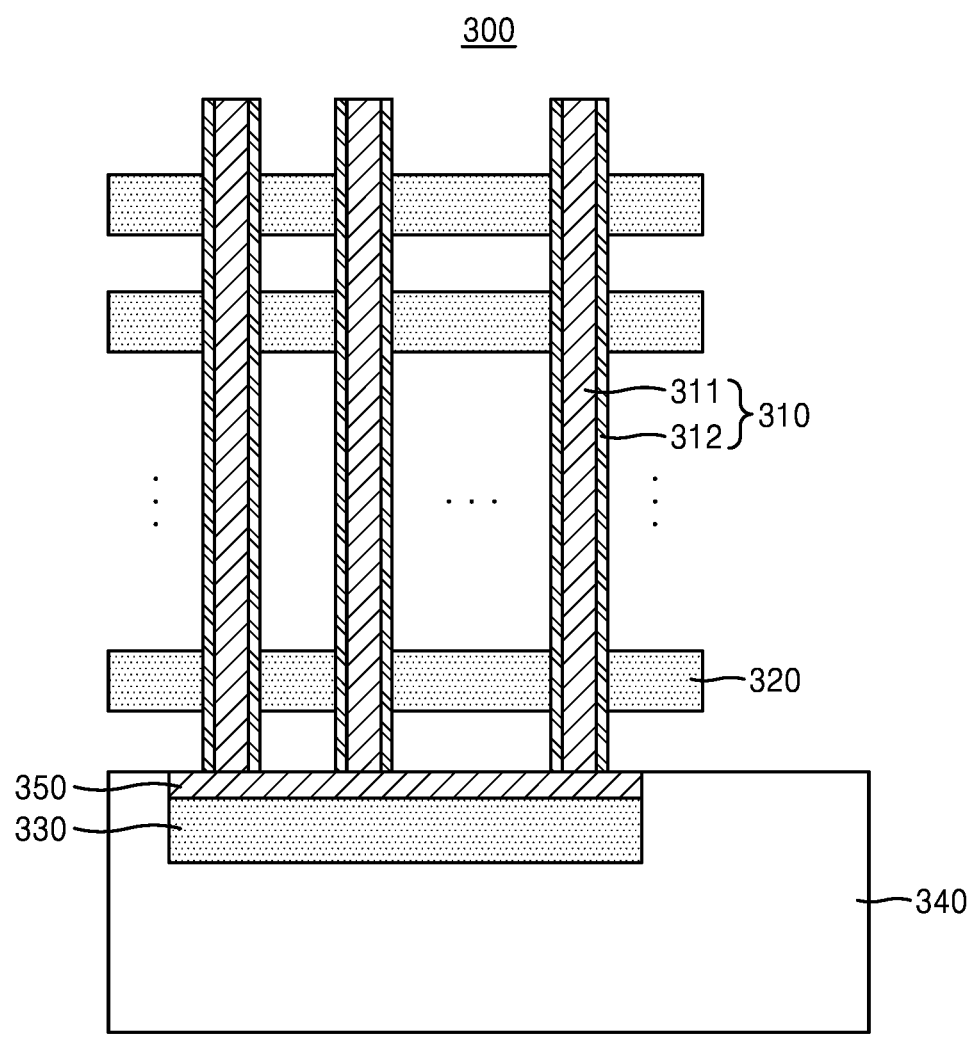
FIG. 3 is a cross-sectional view showing a 3D flash memory according to an embodiment.
Figure 4:
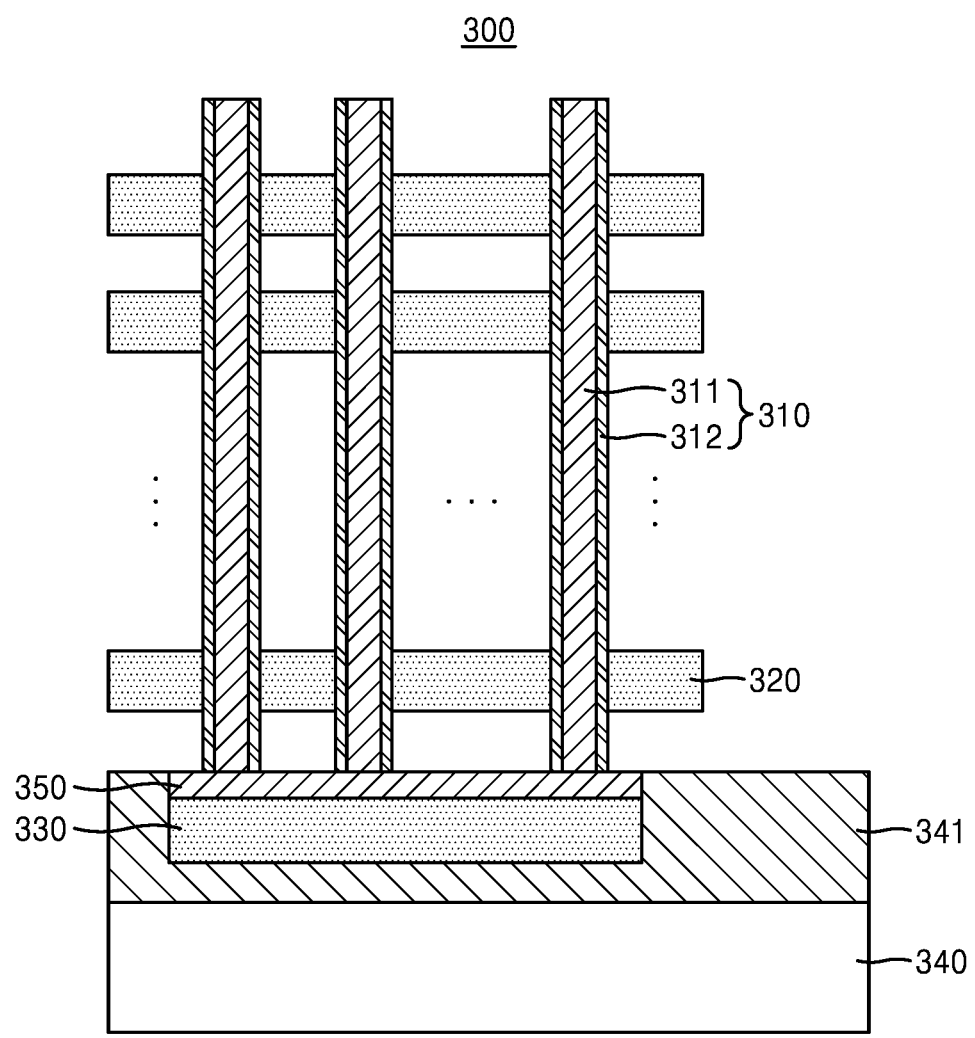
FIGS. 4 to 6 are diagrams illustrating various implementation examples of the 3D flash memory described with reference to FIG. 3.
Figure 5:
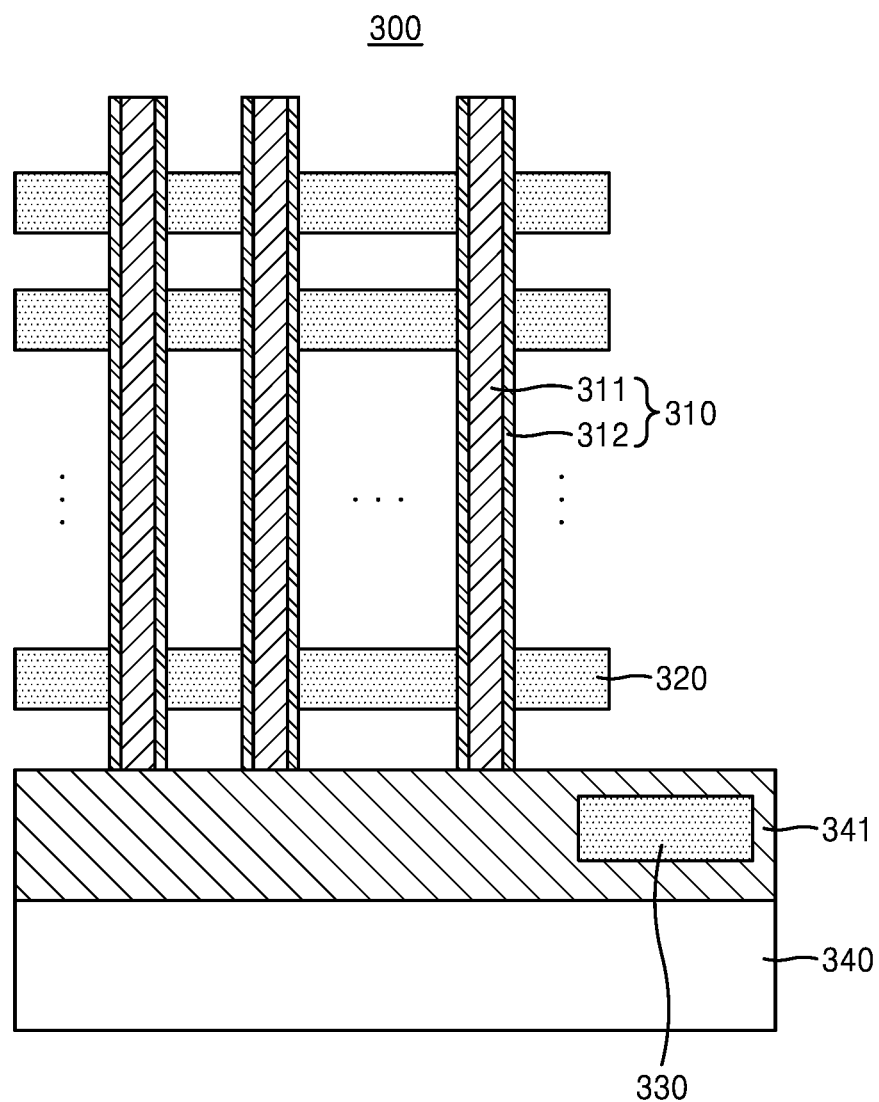
Figure 6:
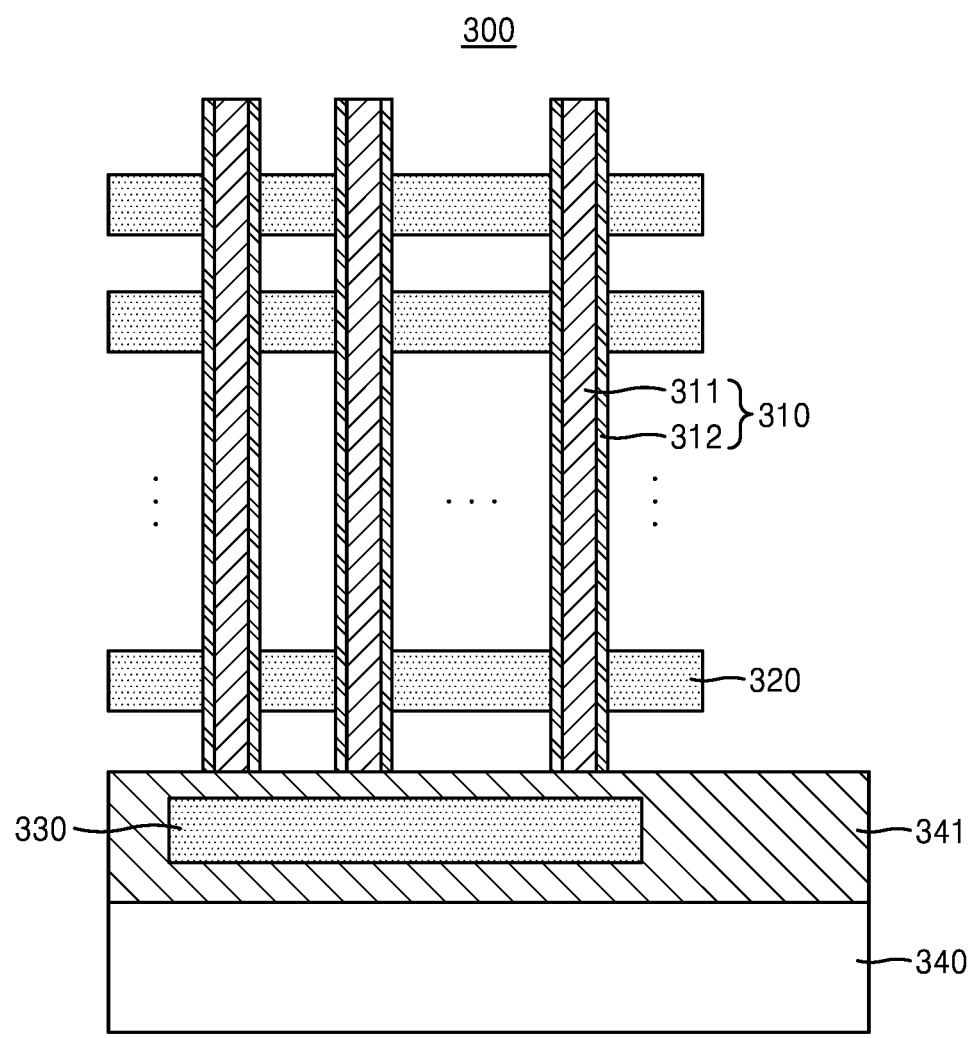

FIG. 3 is a cross-sectional view illustrating a 3D flash memory according to an embodiment, and FIGS. 4 to 6 are diagrams illustrating various implementation examples of the 3D flash memory described with reference to FIG. 3.

Referring to FIGS. 3 to 6, a 3D flash memory 300 according to an embodiment includes at least one vertical string 310, a plurality of electrode layers 320, and a source line 330.

Figure 2:
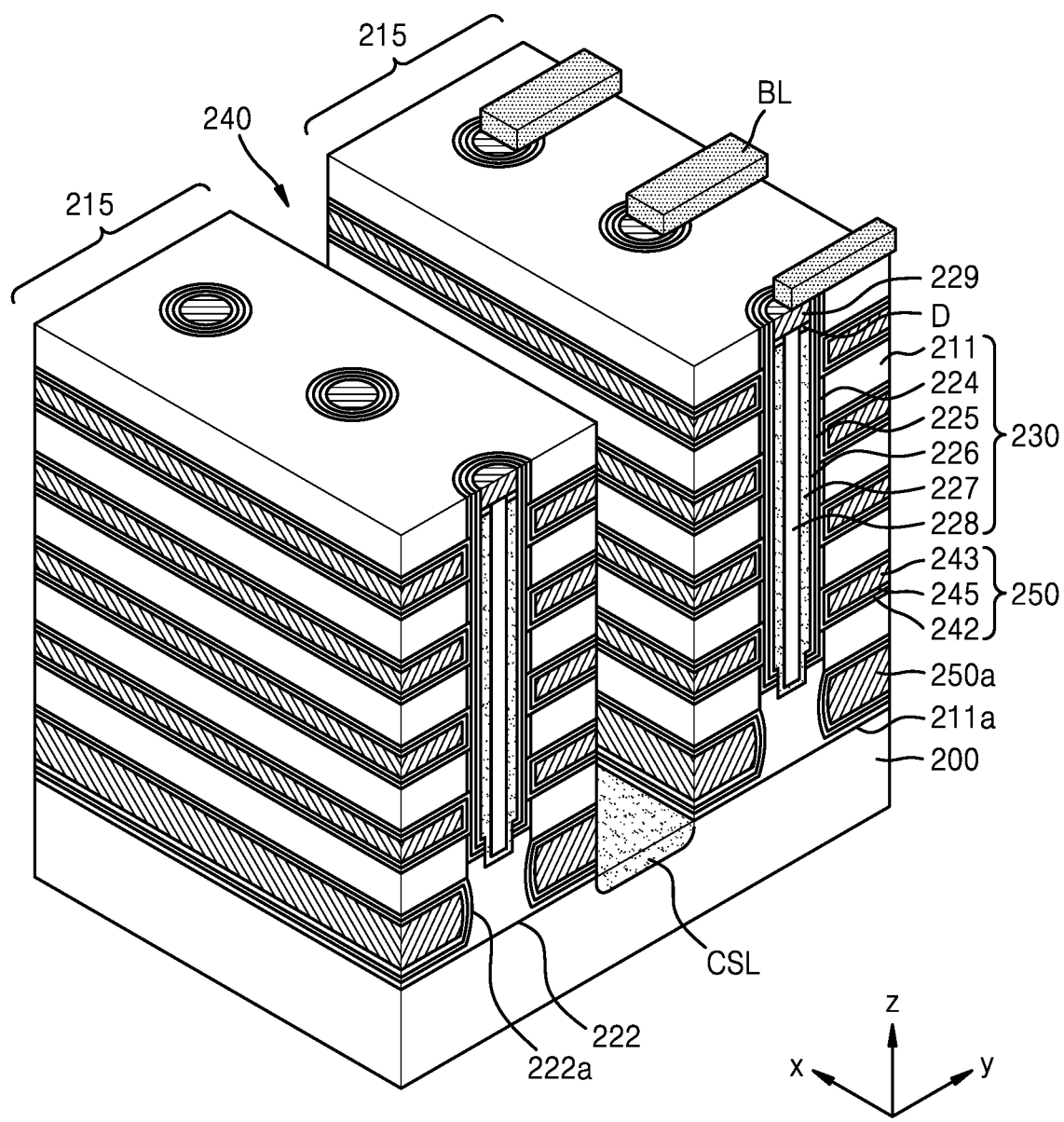
FIG. 2 is a perspective view showing a structure of a 3D flash memory of the related art.

The at least one vertical string 310 is formed to extend in one direction (e.g., in a z-axis direction in FIG. 2) on a substrate 340, and includes a channel layer 311 formed to extend in one direction and a charge storage layer 312 formed to extend in one direction to surround the channel layer 311. The channel layer 311 may include single crystal silicon or poly-silicon, and may be formed by a selective epitaxial growth process or a phase change epitaxial process that uses the substrate 340 as a seed. The charge storage layer 312 is a component that stores charges from current flowing through the plurality of electrode layers 320, and may be formed, for example, in a structure of oxide-nitride-oxide (ONO). Hereinafter, it is described that the charge storage layer 312 includes only a vertical element formed to extend in one direction orthogonal to the substrate 340, but is not limited thereto and may further include a horizontal element in parallel with and in contact with the plurality of electrode layers 320.

Further, although not shown in the drawing, a drain line (not shown) may be connected to an upper portion of the at least one vertical string 310.

The plurality of electrode layers 320 are stacked to be vertically connected to the at least one vertical string 310 and are formed to extend in a second direction (e.g., a y-axis direction in FIG. 2) perpendicular to the first direction. A conductive material such as tungsten, titanium, or tantalum may be used as a material of the plurality of electrode layers 320.

The source line 330 is buried in the substrate 340 and includes the conductive material such as tungsten, titanium, or tantalum. Since the source line 330 is formed to be buried in the substrate 340 as described above, the 3D flash memory 300 according to an embodiment may achieve a remarkable improvement in a degree of integration compared to a structure in which the source line 330 occupies a predetermined space on the substrate 340. Such a source line 330 may be formed not only on the substrate 340 itself, but may be formed to be buried in an N+ junction region 341 in the substrate 340 as shown in FIG. 4.

In this regard, the source line 330 is formed to be common and usable by the at least one vertical string 310. For example, the source line 330 may be formed in a region corresponding to the at least one vertical string 310 in the substrate 340 so as to be common and usable by the at least one vertical string 310 as shown in FIG. 3. As another example, the source line 330 may be formed to be electrically connected to the at least one vertical string 310 in an arbitrary region in the substrate 310 so as to be common and usable by the at least one vertical string 310 as shown in FIG. 5.

In addition, an N+ doped polysilicon layer 350 formed to be buried in the substrate 340 may be disposed on the source line 330, but is not limited thereto, and the N+ doped polysilicon layer 350 may be adaptively omitted.

Various implementation examples of the source line 330 formed to be buried in the substrate 340 described above are as shown in FIGS. 4 to 6.

Figure 7:
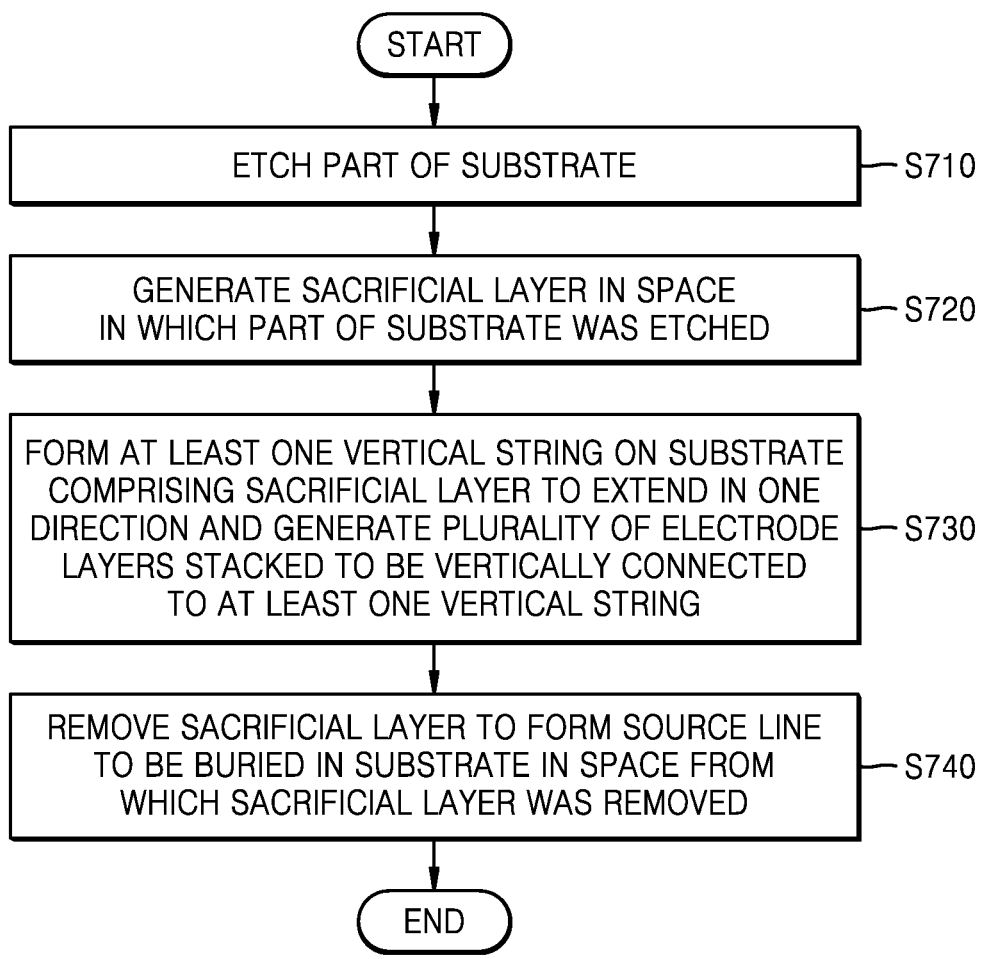
FIG. 7 is a flowchart illustrating a method of manufacturing a 3D flash memory according to an embodiment.

FIG. 7 is a flowchart illustrating a method of manufacturing a 3D flash memory according to an embodiment, and FIGS. 8 to 11 are diagrams illustrating a method of manufacturing a 3D flash memory according to an embodiment.

Hereinafter, the 3D flash memory manufactured by the method of manufacturing the 3D flash memory has the structure described above with reference to FIG. 3. In addition, hereinafter, an automated and mechanized manufacturing system may be used as a subject performing the manufacturing method of the 3D flash memory.

Figure 8:
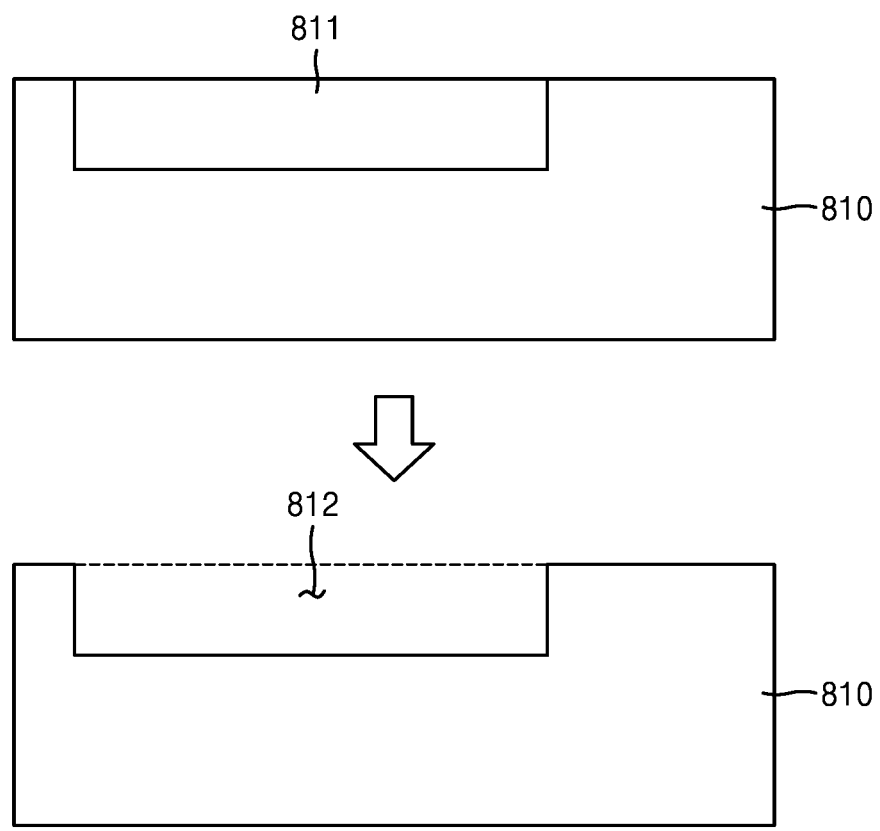
FIGS. 8 to 11 are diagrams illustrating a method of manufacturing a 3D flash memory according to an embodiment.

Referring to FIGS. 7 to 11, the manufacturing system according to an embodiment etches a part 811 of a substrate 810 as shown in FIG. 8 in operation S710. In particular, in operation S710, the manufacturing system may etch the part 811 of the substrate 810 such that a source line 1110 to be formed in a space 812 in which the part 811 of the substrate 810 is etched is common and usable by at least one vertical string 1010. For example, the manufacturing system may etch the part 811 that is a region corresponding to the at least one vertical string 1010 in the substrate 810 such that the source line 1110 is common and usable by the at least one vertical string 1010. As another example, the manufacturing system may etch the part 811 that is an arbitrary region such that the source line 1110 is common by the at least one vertical string 1010 and is electrically connected to the at least one vertical string 1010 in the arbitrary region within the substrate 810.

In this case, in operation S710, the manufacturing system may utilize various physical and chemical etching methods.

Figure 9:
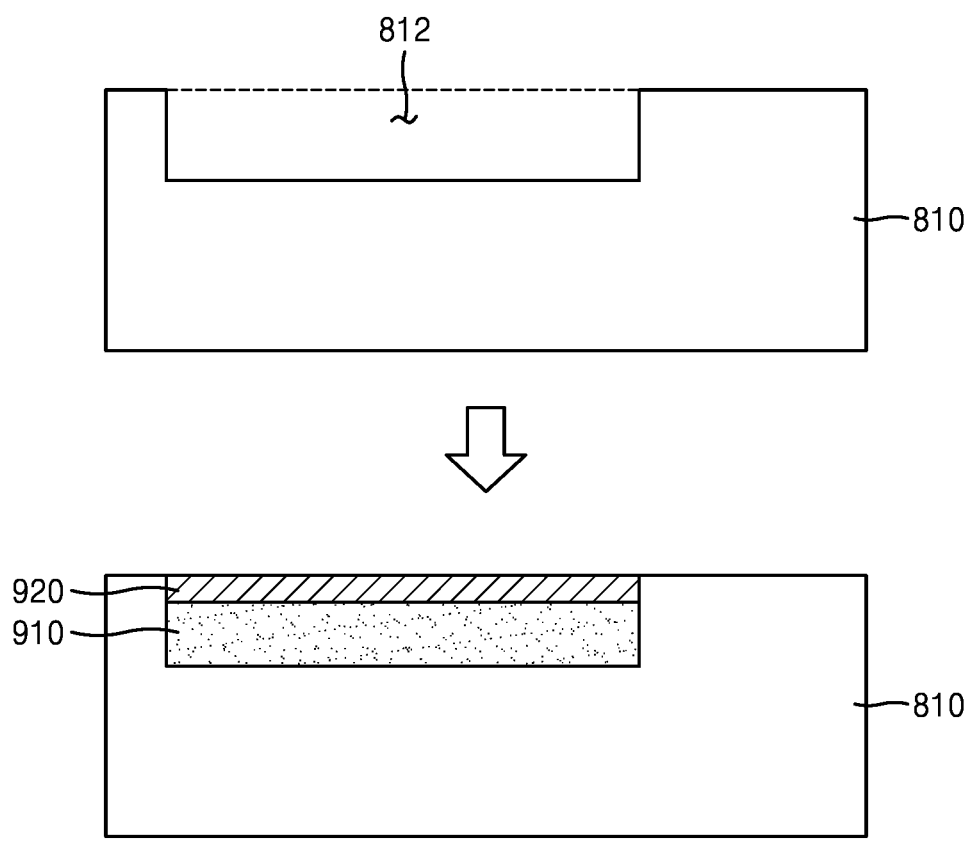

Subsequently, in operation S720, the manufacturing system generates a sacrificial layer 910 in the space 812 in which the part 811 of the substrate 810 is etched as shown in FIG. 9. At this time, in a process of generating the sacrificial layer 910 in operation S720, the manufacturing system may form a polysilicon layer 920 doped with N+ so as to be buried in the substrate 810 on an upper portion of the sacrificial layer 910. The N+ doped polysilicon layer 920 may be adaptively omitted.

Figure 10:
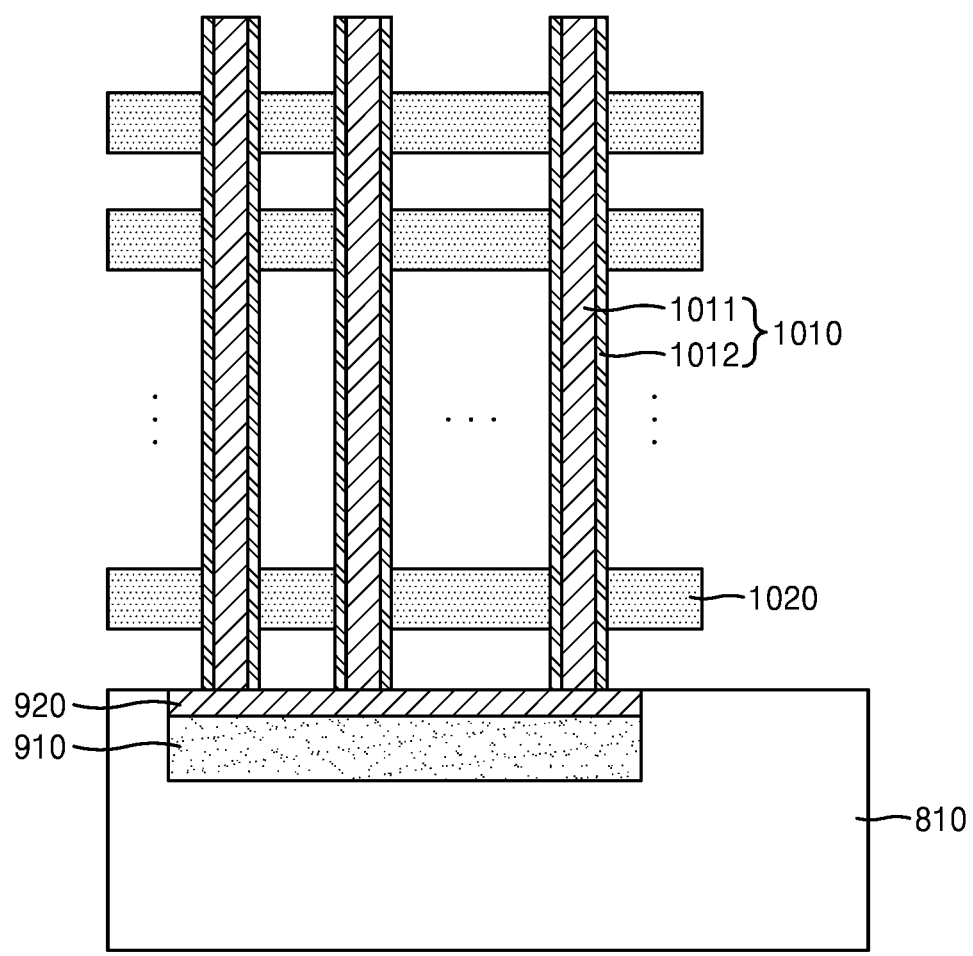

Next, in operation S730, the manufacturing system forms to extend the at least one vertical string 1010 in one direction on the substrate 810 including the sacrificial layer 910 and generates a plurality of electrode layers 1020 stacked to be vertically connected to the at least one vertical string 1010 as shown in FIG. 10. More specifically, the manufacturing system may form to extend the at least one vertical string 1010 including a channel layer 1011 and a charge storage layer 1012 surrounding the channel layer 1011 in one direction on the substrate 810. At this time, the channel layer 1011 may include single crystal silicon or poly-silicon through a selective epitaxial growth process or a phase transition epitaxial process that uses the substrate 810 as a seed. In addition, the charge storage layer 1012 may be formed in a structure of, for example, ONO, so as to store charges from current flowing through the plurality of electrode layers 1020.

Although it is described that the at least one vertical string 1010 and the plurality of electrode layers 1020 are formed at the same time in operation S730, substantially, a mold structure in which the plurality of electrode layers 1020 and a plurality of insulating layers (not shown) are alternately stacked and disposed on the substrate 810 and then at least one vertical hole may be formed to penetrate the mold structure in one direction, and the at least one vertical string 1010 may be formed in the at least one vertical hole.

Figure 11:
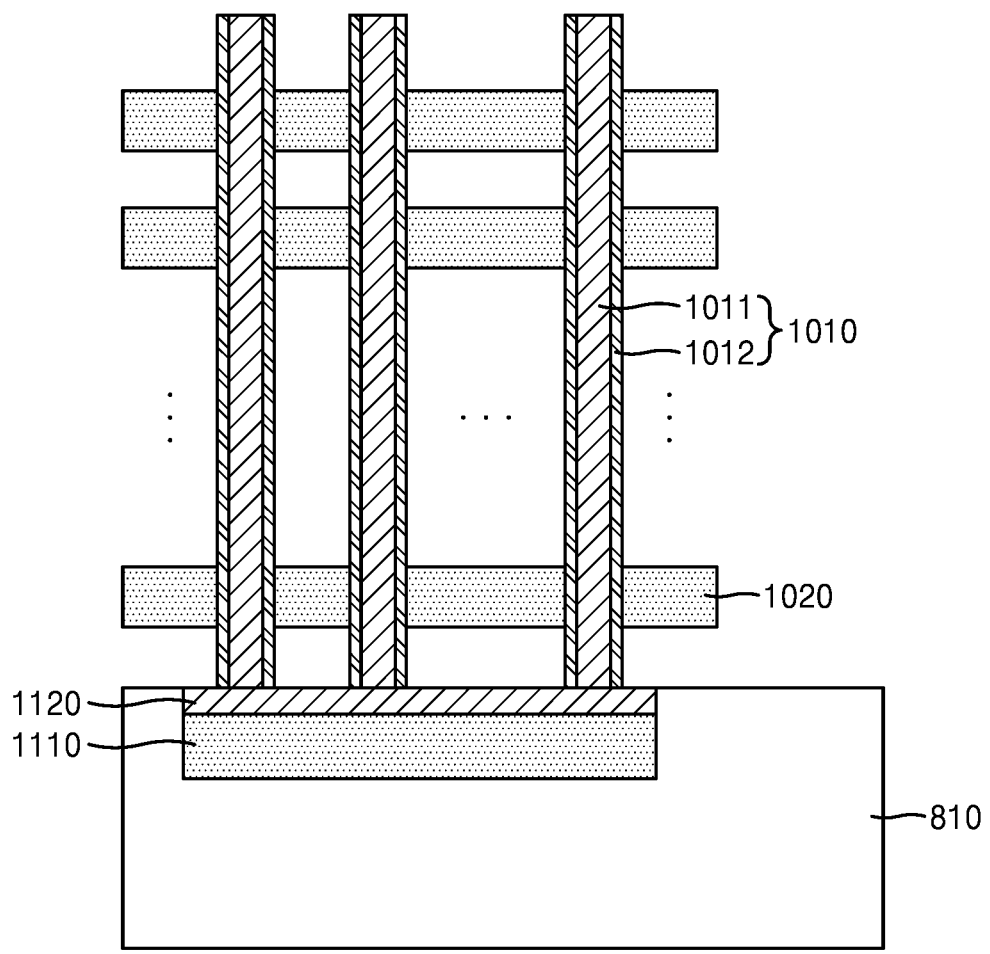

Thereafter, in operation S740, the manufacturing system removes a sacrificial layer 910 to form a source line 1110 so as to be buried in the substrate 810 in a space from which the sacrificial layer 910 is removed as shown in FIG. 11. Here, in operation S740, the manufacturing system may form the source line 1110 using a conductive material such as tungsten, titanium, or tantalum.

As described above, the method of manufacturing the 3D flash memory according to an embodiment may use the sacrificial layer 910 in forming the source line 1110, thereby achieving a technology effect of significantly reducing a process complexity.

In addition, the manufacturing system may utilize the sacrificial layer in the process of forming the plurality of electrode layers 1020. A detailed description in this regard will be given below.

Figure 12:
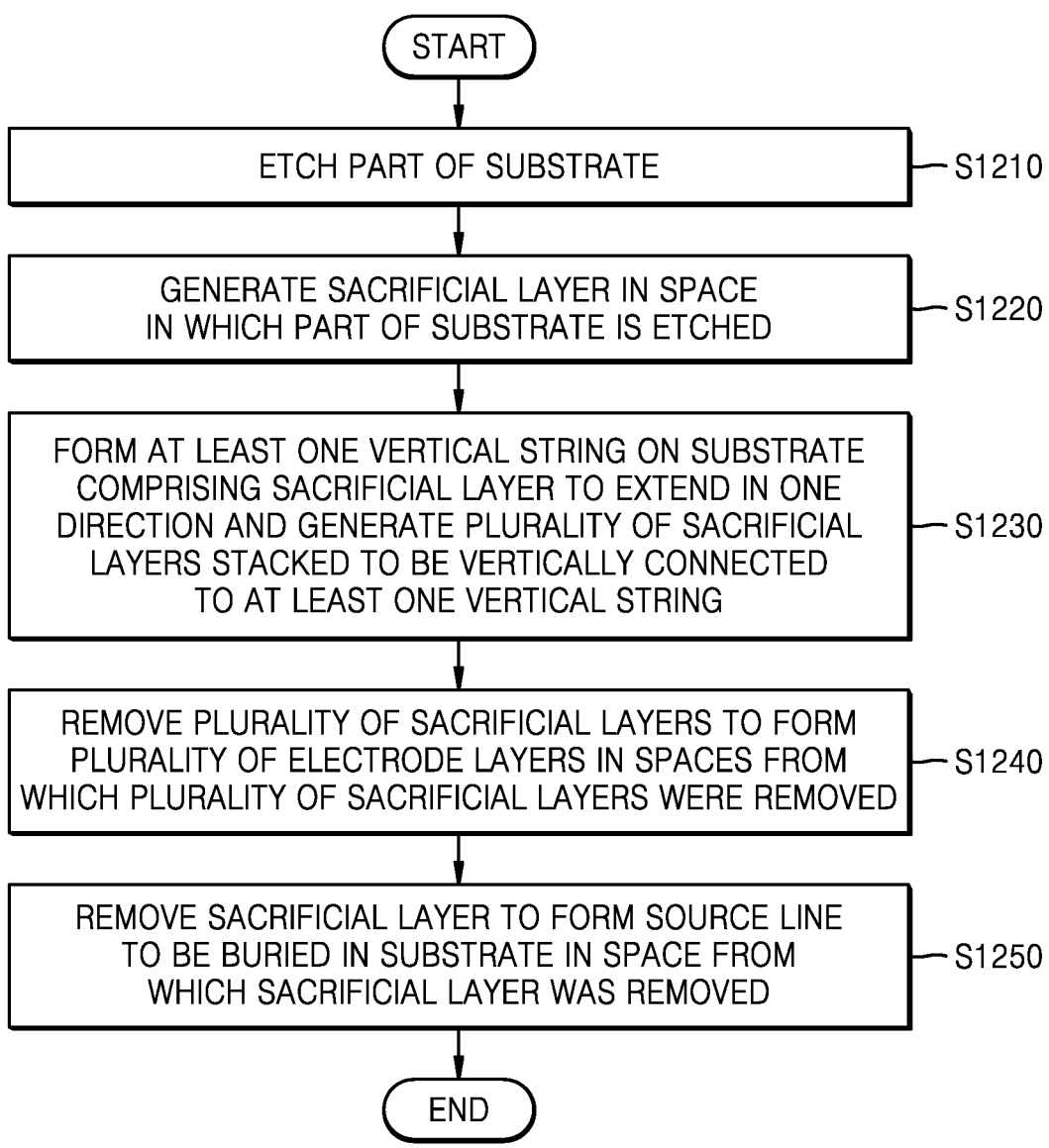
FIG. 12 is a flowchart illustrating a method of manufacturing a 3D flash memory according to another embodiment.

FIG. 12 is a flowchart illustrating a method of manufacturing a 3D flash memory according to another embodiment, and FIGS. 13 to 16 are diagrams illustrating a method of manufacturing a 3D flash memory according to an embodiment.

Hereinafter, the 3D flash memory manufactured by the method of manufacturing the 3D flash memory has the structure described above with reference to FIG. 3. In addition, hereinafter, an automated and mechanized manufacturing system may be used as a subject performing the manufacturing method of the 3D flash memory.

Figure 13:
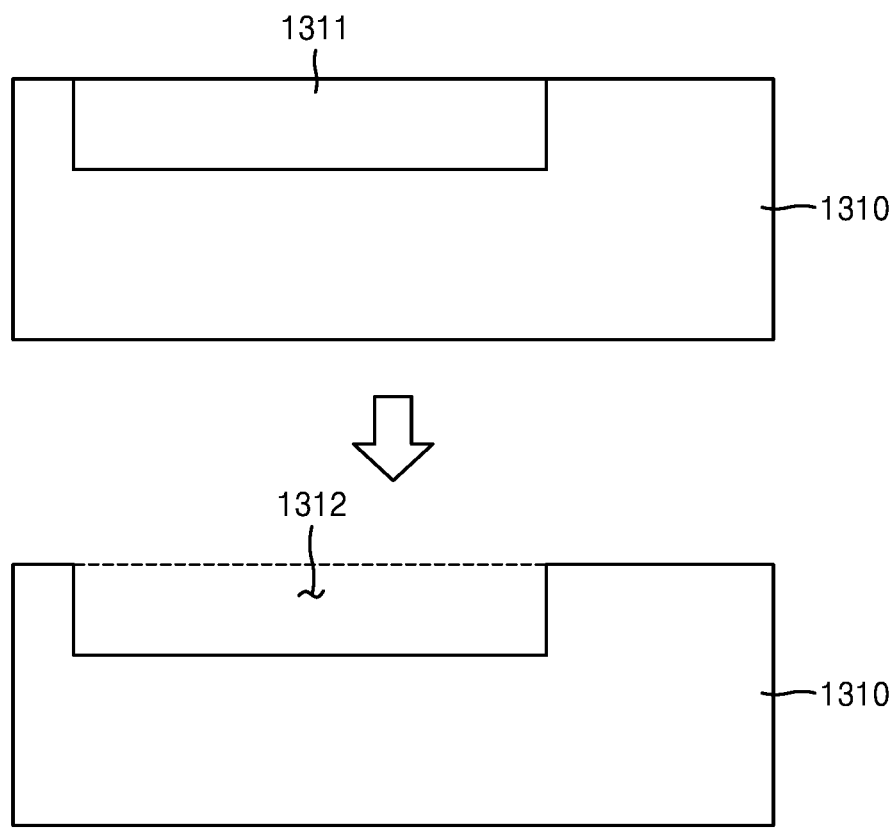
FIGS. 13 to 16 are diagrams illustrating a method of manufacturing a 3D flash memory according to an embodiment.

Referring to FIGS. 12 to 16, the manufacturing system according to another embodiment etches a part 1311 of a substrate 1310 as shown in FIG. 13 in operation S1210. In particular, in operation S1210, the manufacturing system may etch the part 1311 of the substrate 1310 such that a source line 1640 to be formed in a space 1312 in which the part 1311 of the substrate 1310 is etched is common and usable by at least one vertical string 1510. For example, the manufacturing system may etch the part 1311 that is a region corresponding to the at least one vertical string 1510 in the substrate 1310 such that the source line 1640 is common and usable by the at least one vertical string 1510. As another example, the manufacturing system may etch the part 1311 that is an arbitrary region such that the source line 1640 is common by the at least one vertical string 1510 and is electrically connected to the at least one vertical string 1510 in the arbitrary region within the substrate 1310

In this case, in operation S1210, the manufacturing system may utilize various physical and chemical etching methods.

Figure 14:
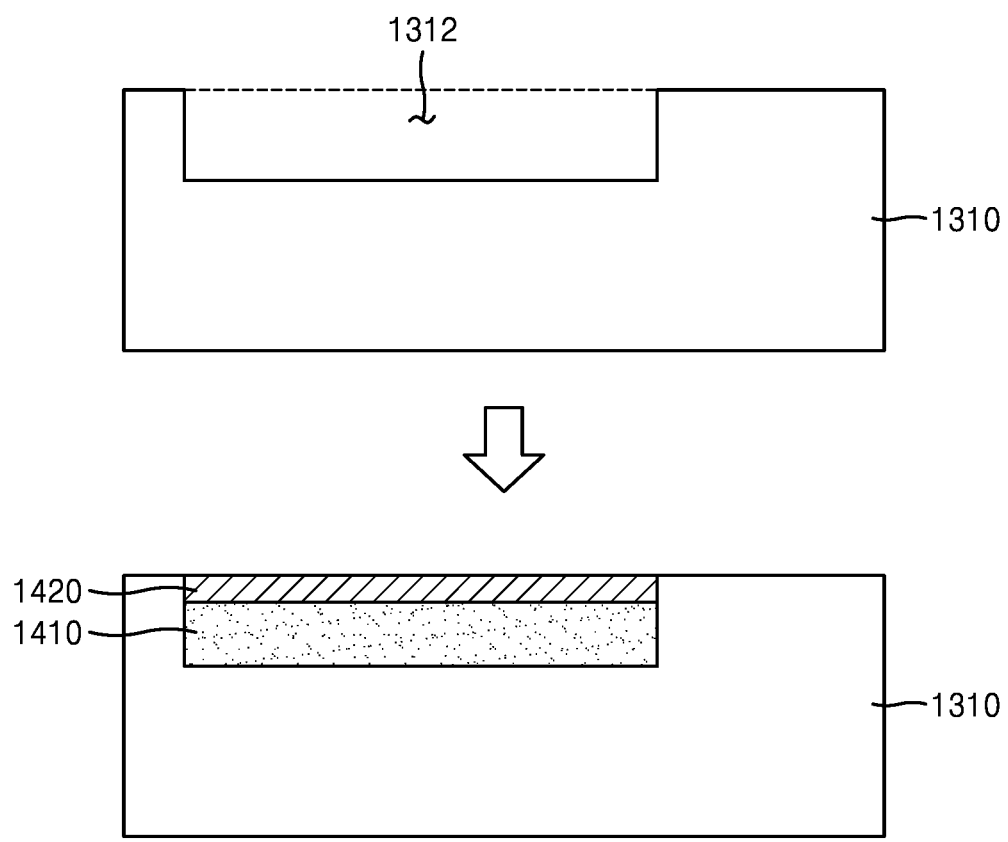

Subsequently, in operation S1220, the manufacturing system generates a sacrificial layer 1410 in the space 1312 in which the part 1311 of the substrate 1310 is etched as shown in FIG. 14. At this time, in a process of generating the sacrificial layer 1410 in operation S1220, the manufacturing system may form a polysilicon layer 1420 doped with N+ so as to be buried in the substrate 1310 on an upper portion of the sacrificial layer 1410. The N+ doped polysilicon layer 1420 may be adaptively omitted.

Figure 15:
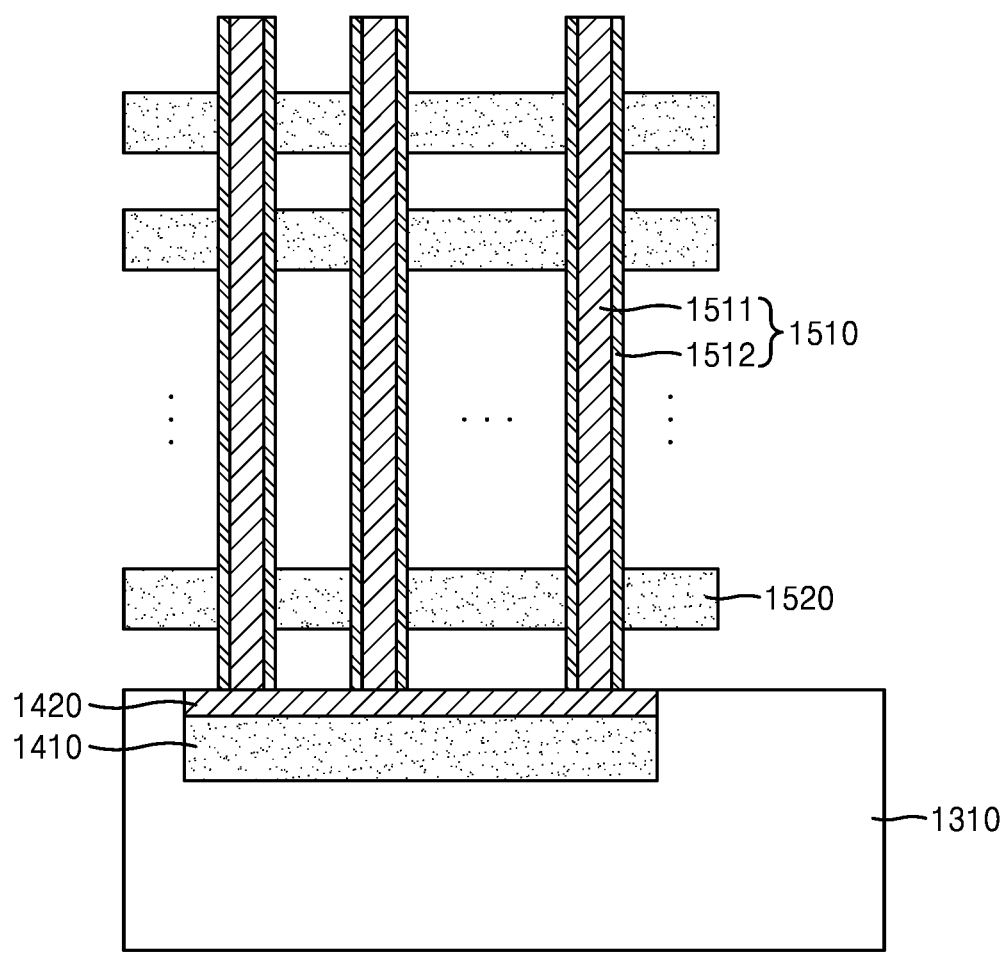

Next, in operation S1230, the manufacturing system forms to extend the at least one vertical string 1510 in one direction on the substrate 1310 including the sacrificial layer 1410 and generates a plurality of sacrificial layers 1520 stacked to be vertically connected to the at least one vertical string 1510 as shown in FIG. 15.

In more detail, the manufacturing system may extend at least one vertical string 1010 including the channel layer 1511 and the charge storage layer 1512 surrounding the channel layer in one direction on the substrate 1310. At this time, the channel layer 1511 may include single crystal silicon or poly-silicon through a selective epitaxial growth process or a phase transition epitaxial process that uses the substrate 1310 as a seed. In addition, the charge storage layer 1512 may be formed in a structure of, for example, ONO, so as to store charges from current flowing through a plurality of electrode layers 1610.

Although it is described that the at least one vertical string 1510 and the plurality of electrode layers 1520 are formed at the same time in operation S1230, substantially, a mold structure in which the plurality of sacrificial layers 1520 and a plurality of insulating layers (not shown) are alternately stacked and disposed on the substrate 1310 and then at least one vertical hole may be formed to penetrate the mold structure in one direction, and the at least one vertical string 1510 may be formed in the at least one vertical hole.

Figure 16:
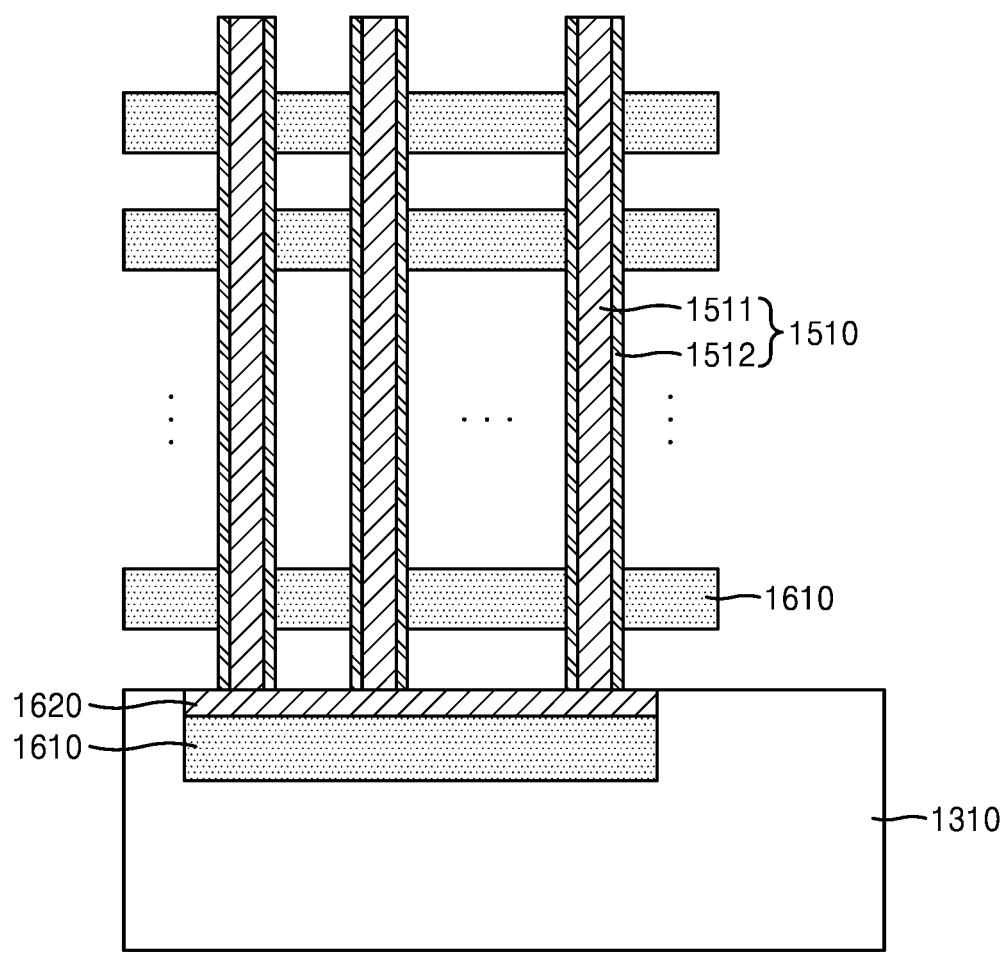

Next, in operation S1240, the manufacturing system removes the plurality of sacrificial layers 1520 to form a plurality of electrode layers 1610 in spaces from which the plurality of sacrificial layers 1520 are removed as shown in FIG. 16.

Thereafter, in operation S1250, the manufacturing system removes the sacrificial layer 1410 to form a source line 1620 so as to be buried in the substrate 1310 in the space from which the sacrificial layer 1410 is removed as shown in FIG. 16. Here, in operation S1250, the manufacturing system may form the source line 1620 using a conductive material such as tungsten, titanium, or tantalum.

In particular, operations S1240 and S1250 are performed simultaneously. That is, after the plurality of sacrificial layers 1520 and the sacrificial layer 1410 are simultaneously removed, the plurality of electrode layers 1610 and the source line 1620 may be simultaneously formed through a deposition process.

As described above, the method of manufacturing the 3D flash memory according to an embodiment may simultaneously form the plurality of electrode layers 1610 and the source line 1620, thereby achieving a technology effect of simplifying a process.

Figure 17:
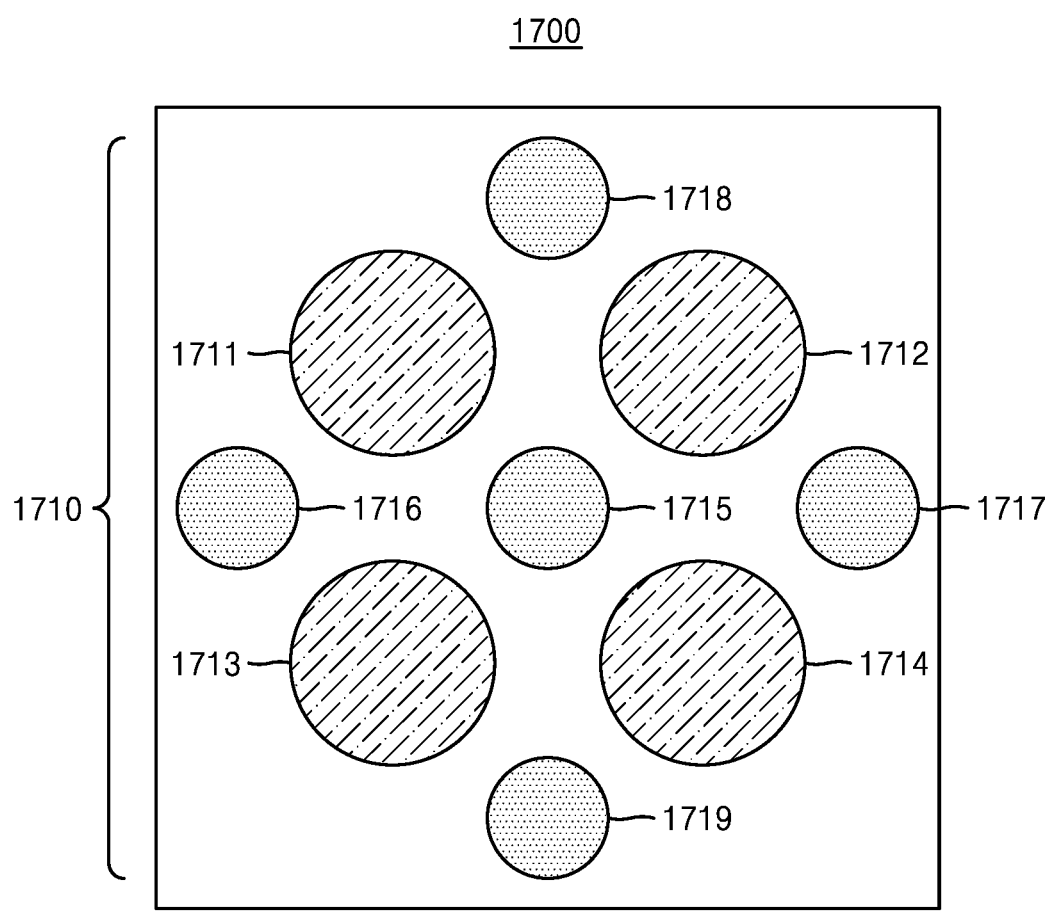
FIG. 17 is a top view showing a 3D flash memory according to an embodiment.

FIG. 17 is a top view showing a 3D flash memory according to an embodiment.

Referring to FIG. 17, a 3D flash memory 1700 according to an embodiment has a structure including a plurality of vertical strings 1710 formed to extend in one direction and a plurality of horizontal electrode layers (not shown) connected to the plurality of vertical strings 1710 so as to be orthogonal to the plurality of vertical strings 1710. For example, the 3D flash memory 1700 may include the plurality of vertical strings 1710 each including a channel layer (not shown) formed to extending in one direction (a z-axis direction in FIG. 2) and a charge storage layer (not shown) formed to extend in the same direction to surround the channel layer.

In the 3D flash memory 1700 according to an embodiment, the plurality of vertical strings 1710 are grouped into at least two or more groups having different cross-sectional areas. For example, a first vertical string 1711, a second vertical string 1712, a third vertical string 1713, and a fourth vertical string 1714 may be grouped into a first group having a relatively wide cross-sectional area, and a fifth vertical string 1715, a sixth vertical string 1716, a seventh vertical string 1717, an eighth vertical string 1718 and a ninth vertical string 1719 may be grouped into a second group having a relatively small cross-sectional area. Hereinafter, the strings 1711 and 1715 having different cross-sectional areas means that the channel layer and the charge storage layer included in each of the strings 1711 and 1715 have different cross-sectional thicknesses.

Accordingly, as the thickness of the charge storage layer of each of the strings 1711 and 1715 is different, the strings 1711 and 1715 may have characteristics of different amounts of data storage. That is, the plurality of vertical strings 1710 has characteristics of different amounts of data storage for each group. For example, the first vertical string 1711 may have a characteristic of a 3-bit multi level cell (MLC), and the fifth vertical string 1715 may have a characteristic of a 2-bit MLC.

Here, the plurality of vertical strings 1710 may be formed such that spaces between the plurality of vertical strings 1710 are the same regardless of the group. For example, a distance between the first vertical string 1711 and the second vertical string 1712 included in the first group may be the same as a space between the fifth vertical string 1715 and the sixth vertical string 1716 included in the second group.

Meanwhile, the plurality of vertical strings 1710 may be formed so that spaces between the plurality of vertical strings 1710 are different for each group. For example, the distance between the first vertical string 1711 and the second vertical string 1712 included in the first group may be different from the space between the fifth vertical string 1715 and the sixth vertical string 1716 included in the second group. Spaces between the vertical strings 1711, 1712, 1713, and 1714 in the group may be the same.

The plurality of vertical strings 1710 may be formed through different etching processes for each group, and vertical strings included in one group may be formed simultaneously through the same etching process. Hereinafter, different etching processes mean processes of etching different cross-sectional areas, and performing different etching processes for each group means performing the same type of etching process for each group by adjusting the size of an etching cross-sectional area.

For example, the first vertical string 1711, the second vertical string 1712, the third vertical string 1713, and the fourth vertical string 1714 included in the first group are formed simultaneously through a first etching process, and then the fifth vertical string 1715, the sixth vertical string 1716, the seventh vertical string 1717, the eighth vertical string 1718 and the ninth vertical string included in the second group may be formed simultaneously through a second etching process.

In this regard, the first etching process and the second etching process applied to the groups may be the same etching process. For example, the first etching process and the second etching process may be a photolithography process. However, the present invention is not restricted or limited thereto, and the first etching process and the second etching process applied to the groups may be different etching processes. For example, the first etching process may be a dry etching process, and the second etching process may be a wet etching process.

As described above, the 3D flash memory 1700 having a structure in which the plurality of vertical strings 1710 are grouped into at least two or more groups having different cross-sectional areas applies different etching processes for each group and forms vertical strings included in one group simultaneously through the same etching process, thereby achieving a degree of integration, simplifying a manufacturing process, and minimizing etching errors.

As described above, it is described that the plurality of vertical strings 1710 are grouped into two groups having two different cross-sectional areas, but is not restricted or limited thereto, and the plurality of vertical strings 1710 may also be grouped into three or more groups having three or more different cross-sectional areas. Likewise, in this case, different etching processes may be applied for each of three or more groups.

In addition, it is described that the plurality of vertical strings 1710 are arranged to dislocate from each other (in a staggered form) on the cross-section of the 3D flash memory 1700, but is not restricted or limited thereto, and the plurality of vertical strings 1710 may be arranged in a checkerboard form according to columns and rows.

A method of manufacturing the 3D flash memory 1700 described above will be described with reference to FIGS. 18 and 21.

Figure 18:
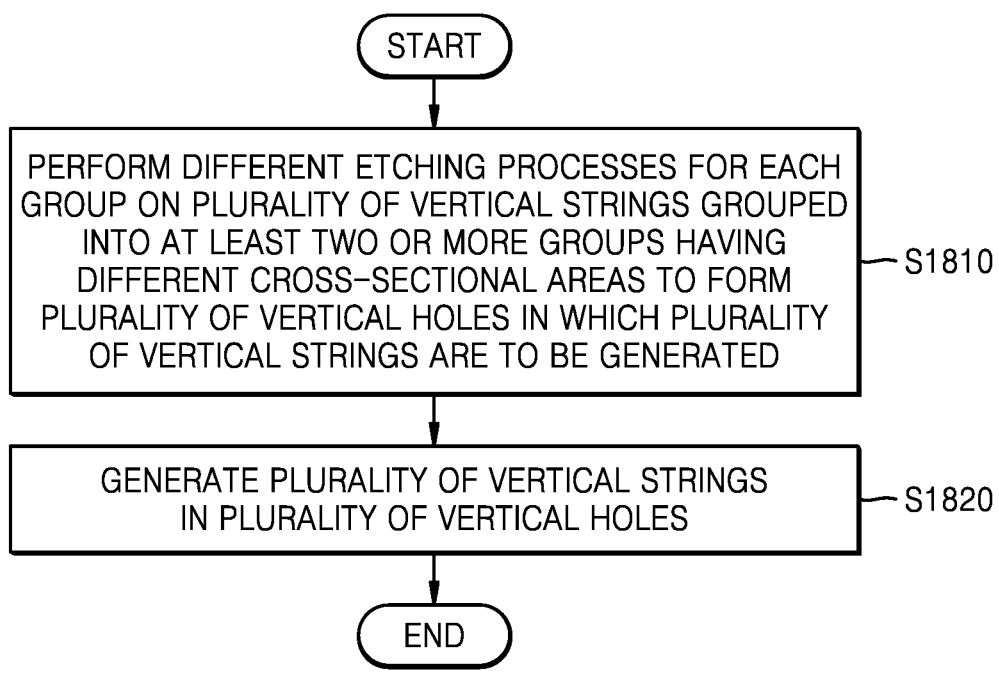
FIG. 18 is a flowchart illustrating a method of manufacturing a 3D flash memory according to an embodiment.
Figure 19:
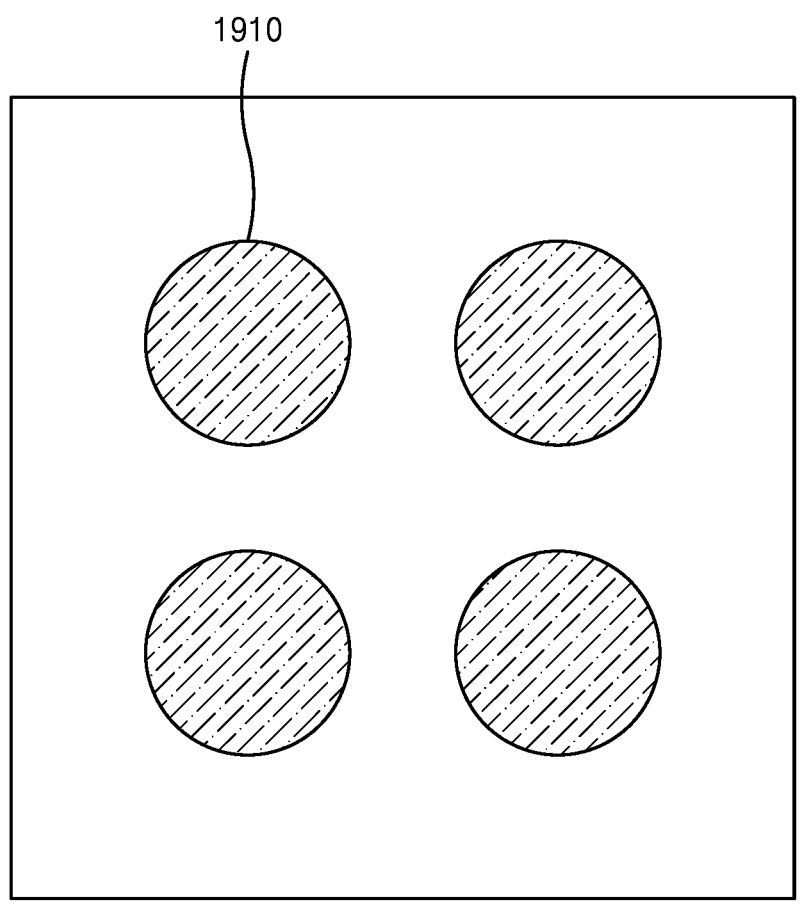
FIGS. 19 to 21 are diagrams illustrating a method of manufacturing a 3D flash memory according to an embodiment.
Figure 20:
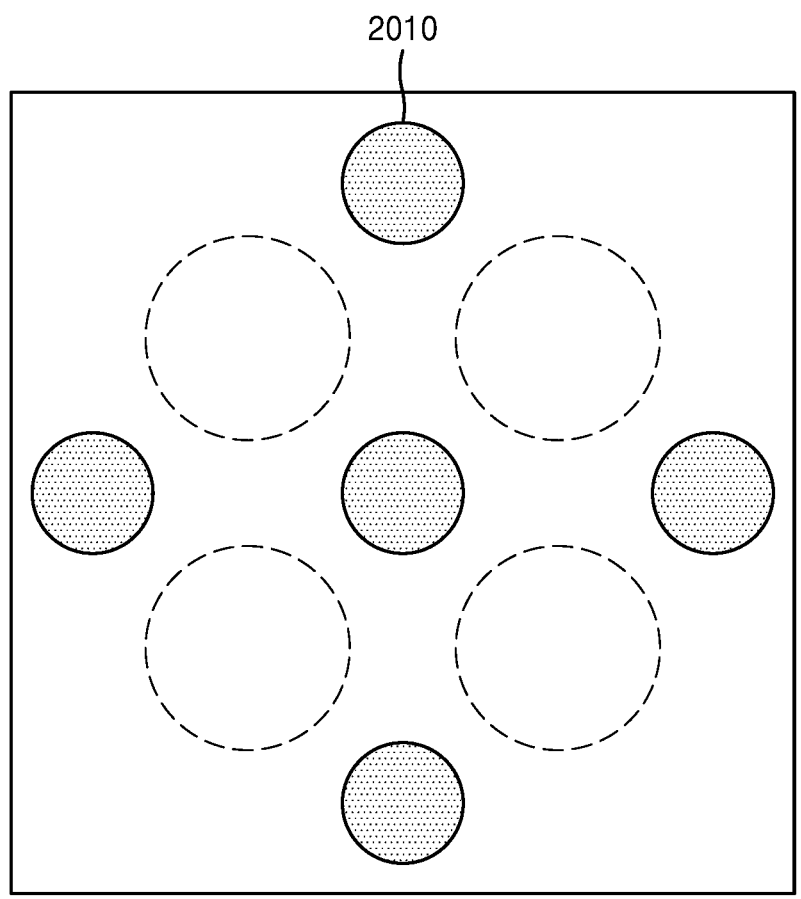
Figure 21:
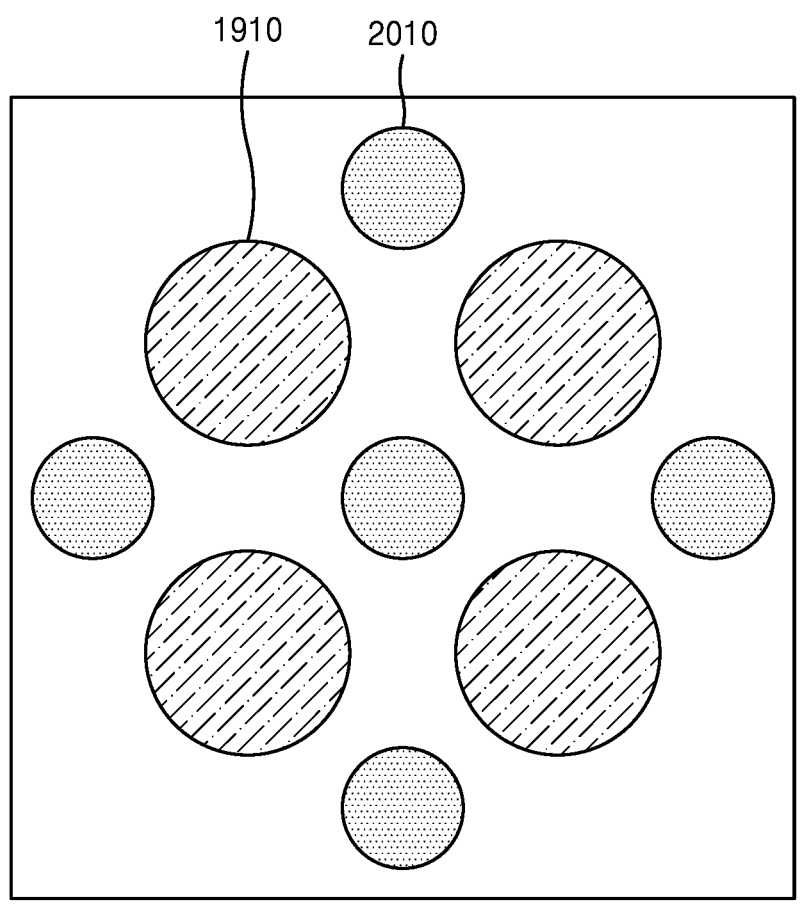

FIG. 18 is a flowchart illustrating a method of manufacturing a 3D flash memory according to an embodiment, and FIGS. 19 to 21 are diagrams illustrating a method of manufacturing a 3D flash memory according to an embodiment.

Hereinafter, the 3D flash memory manufactured by the method of manufacturing the 3D flash memory has the structure described above with reference to FIG. 17. In addition, hereinafter, an automated and mechanized manufacturing system may be used as a subject performing the manufacturing method of the 3D flash memory.

Referring to 18 to 21, in operation S1810, the manufacturing system according to an embodiment may perform different etching processes for each group on a plurality of vertical strings grouped into at least two or more groups having different cross-sectional areas to form a plurality of vertical holes in which a plurality of vertical strings are to be generated. Here, different etching processes mean processes of etching different cross-sectional areas.

That is, in operation S1810, the manufacturing system may form vertical holes in which vertical strings included in one group are to be formed simultaneously through the same etching process. Thus, operation S1810 may mean an operation of forming a plurality of vertical holes in which a plurality of vertical strings are to be generated in different cross-sectional areas for each group.

For example, the manufacturing system implements a mask pattern used in a first etching process of forming vertical holes 1910 in which vertical strings included in a first group are to be generated as shown in FIG. 19, thereby performing a first etching process by utilizing the mask pattern of FIG. 19 to form the vertical holes 1910 corresponding to the first group. Subsequently, the manufacturing system implements a mask pattern used in a second etching process of forming vertical holes 2010 in which vertical strings included in a second group are to be generated as shown in FIG. 20, thereby performing a second etching process by utilizing the mask pattern of FIG. 20 to form the vertical holes 2010 corresponding to the second group. Accordingly, the vertical holes 1910 corresponding to the first group and the vertical holes 2010 corresponding to the second group may be formed as shown in FIG. 21.

In this regard, in operation S1810, the manufacturing system may form the plurality of vertical holes in which the plurality of vertical strings are to be generated in different cross-sectional areas for each group so that the plurality of vertical strings have characteristics of different amounts of data storage for each group.

In operation S1810, instead of repeatedly performing the same etching process for each group, the manufacturing system may perform different etching processes for each group.

In addition, in operation S1810, the manufacturing system may form the plurality of vertical holes in which the plurality of vertical strings are to be generated so that the plurality of vertical strings dislocate from each other on a cross-section of the 3D flash memory.

In addition, in operation S1810, the manufacturing system may form the plurality of vertical strings so that spaces between the plurality of vertical strings are the same regardless of the group. Meanwhile, the manufacturing system may form the plurality of vertical strings so that spaces between the plurality of vertical strings are different for each group (the vertical strings may be formed so that spaces between the vertical strings in the group are the same).

Thereafter, in operation S1820, the manufacturing system may manufacture the 3D flash memory by generating the plurality of vertical strings in the plurality of vertical holes. A process of generating the plurality of vertical strings in the plurality of vertical holes is the same as the existing process, and thus a detailed description thereof is omitted.

As described above, although a process of forming a plurality of electrode layers (not shown) orthogonally connected to the plurality of vertical strings is omitted in the description of the method of manufacturing the 3D flash memory, the manufacturing system may prepare a mold structure in which a plurality of interlayer insulating layers and a plurality of electrode layers are alternately stacked before operation S1810, and performing operation S1810 on an upper surface of the mold structure, thereby manufacturing the 3D flash memory including the plurality of electrode layers. In addition, the process of forming the plurality of electrode layers is not restricted or limited to the above, and may be performed through various methods such as using a sacrificial layer.

As described above, although the embodiments have been described by the limited embodiments and drawings, various modifications and variations are possible from the above description to those of ordinary skill in the art. For example, even if the described technologies are performed in an order different from the described method, and/or components such as the described system, structure, device, circuit, etc. are coupled or combined in a form different from the described method, or are replaced or substituted by other components or equivalents, an appropriate result may be achieved.

Therefore, other implementations, other embodiments, and those equivalent to the claims also fall within the scope of the claims to be descibed below.

The invention claimed is:

1. A method of manufacturing a 3-dimensional (3D) flash memory, the method comprising:
   etching a part of a substrate;
   generating a first sacrificial layer in a space in which the part of the substrate was etched;
   forming at least one vertical string on the substrate comprising the first sacrificial layer to extend in one direction;
   generating a plurality of electrode layers stacked to be vertically connected to the at least one vertical string; and removing the first sacrificial layer to form a source line to be buried in the substrate in a space from which the first sacrificial layer was removed.

2. The method of claim 1, wherein the generating of the first sacrificial layer comprises:
forming an N+ doped polysilicon layer in an upper portion of the first sacrificial layer so as to be buried in the substrate.

3. The method of claim 1, wherein the etching of the part of the substrate comprises etching the part of the substrate so that a source line to be formed in a space in which the part of the substrate was etched is common and usable by the at least one vertical string.

4. The method of claim 1, wherein generating a plurality of electrode layers comprising:
generating a plurality of second sacrificial layers stacked to be vertically connected to the at least one vertical string; and
removing the plurality of second sacrificial layers to form the plurality of electrode layers in spaces from which the plurality of second sacrificial layers were removed.

5. The method of claim 4, wherein the forming of the plurality of electrode layers and the forming of the source line are performed simultaneously.

6. The method of claim 4, wherein the generating of the second sacrificial comprises:
forming an N+ doped polysilicon layer on an upper portion of each of the second sacrificial layers so as to be buried in the substrate.

7. The method of claim 4, wherein the etching of the part of the substrate comprises etching the part of the substrate so that a source line to be formed in a space in which the part of the substrate is etched is common and usable by the at least one vertical string.

8. A 3-dimensional (3D) flash memory comprising:
a plurality of vertical strings extending in a vertical direction, each vertical string comprising a channel layer extending in the vertical direction and a charge storage layer extending in the vertical direction and surrounding the corresponding channel layer,
wherein the plurality of vertical strings comprise a first group of vertical strings each having a first horizontal cross-sectional area and a second group of vertical strings each having a second horizontal cross-sectional area, wherein the first horizontal cross-sectional area is greater than the second horizontal cross-sectional area, and
wherein the first group of vertical strings each comprise memory cell transistors each configured to store n bits and the second group of vertical strings each comprise memory cell transistors each configured to store m-bits, where n and m are positive integers and n is greater than m.

9. The 3D flash memory of claim 8,
wherein the first group of vertical strings are formed with a first etching process and the second group of vertical strings are formed with a second etching process,
wherein the first etching process and the second etching process are not performed simultaneously.

10. The 3D flash memory of claim 9, wherein the first group of vertical strings are formed with a first etching process and the second group of vertical strings are formed simultaneously through the same etching process.

11. The 3D flash memory of claim 8, wherein, with respect to a top down view, the first group of vertical strings are arranged in first rows that extend in a first direction, the second group of vertical strings are arranged in second rows that extend in the first direction, and wherein the first rows and second rows are alternately interleaved with one another.

12. The 3D flash memory of claim 11, wherein the vertical stings of the first group and vertical strings of the second group are arranged in a staggered formation such that, with respect to the first direction, vertical strings of the second group are positioned at locations between neighboring ones of the vertical strings of the first group.

13. The 3D flash memory of claim 8, wherein, with respect to a horizontal cross-section, the plurality of vertical strings are formed so that distances between closest immediate neighbors of the plurality of vertical strings are the same regardless of the group.

14. The 3D flash memory of claim 8, wherein the plurality of vertical strings are arranged in a checkerboard form.

15. The 3D flash memory of claim 8, wherein the channel layer and the charge storage layer of the first group of vertical strings have different cross-sectional thicknesses from the channel layer and the charge storage layer of the second group of vertical strings.

16. A method of manufacturing a 3-dimensional (3D) flash memory comprising a plurality of vertical strings extending in a vertical direction, each vertical string comprising a channel layer extending in the vertical direction and a charge storage layer extending in the vertical direction and surrounding the corresponding channel layer, the method comprising:
forming a plurality of vertical holes in a mold structure on a substrate, the mold structure comprising a plurality of sacrificial layers and a plurality of insulating layers that are alternately stacked, including
with a first etching process, forming a first group of vertical holes in the mold structure, and
subsequent to the first etching process, with a second etching process, forming a second group of vertical holes in the mold structure; and
forming a first group of the vertical strings in the first group of vertical holes and forming a second group of the vertical strings in the second group of vertical holes.

17. The method of claim 16,
wherein the forming of the plurality of vertical holes comprises, with respect to a top down view, forming the first group of vertical holes arranged in first rows that extend in a first direction, forming the second group of vertical strings arranged in second rows that extend in the first direction, and
wherein the first rows and second rows are alternately interleaved with one another.

18. The method of claim 17, wherein the vertical stings of the first group and vertical strings of the second group are arranged in a staggered formation such that, with respect to the first direction, vertical strings of the second group are positioned at locations between neighboring ones of the vertical strings of the first group.

19. The method of claim 16, wherein the first group of vertical strings each comprise memory cell transistors each configured to store n bits and the second group of vertical strings each comprise memory cell transistors each configured to store m bits, where n and m are positive integers and n is greater than m.

20. The method of claim 16, wherein the channel layer and the charge storage layer of the first group of vertical strings have different cross-sectional thicknesses from the channel layer and the charge storage layer of the second group of vertical strings.

* * * * *